(12) United States Patent
Lee et al.

(10) Patent No.: US 9,025,774 B2
(45) Date of Patent: May 5, 2015

(54) APPARATUS, METHOD AND COMPUTER-READABLE MEDIUM PRODUCING VERTICAL DIRECTION VIRTUAL CHANNEL

(75) Inventors: Kang Eun Lee, Hwaseong-si (KR); Do Hyung Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 918 days.

(21) Appl. No.: 12/926,198

(22) Filed: Nov. 1, 2010

(65) Prior Publication Data

US 2011/0222693 A1 Sep. 15, 2011

(30) Foreign Application Priority Data

Mar. 11, 2010 (KR) ........................ 10-2010-0021785

(51) Int. Cl.
*H04R 5/00* (2006.01)
*H03G 9/00* (2006.01)

(52) U.S. Cl.
CPC .................................... *H03G 9/005* (2013.01)

(58) Field of Classification Search
CPC ........ H04R 5/02; H04R 2499/13; H04R 3/12; H04R 27/00; H04R 3/04; H04R 2420/07; H04R 1/403; H04R 3/00; H04R 29/001; H04R 1/26; H04R 2205/024; H04R 1/025; H04R 1/345; G10L 21/0208; G10L 19/02; G10L 19/0212; G10L 21/0205; G10L 19/04; G10L 2021/02082; G10L 21/0232; H04S 3/00; H04S 1/002; H04S 2420/01; H04S 7/30; H04S 3/008; H04S 1/007; H04S 7/302; H04S 5/00; H04S 2400/01; H04S 5/005; H04S 7/40; H04S 7/00; H04S 7/303; H04S 2400/05; H04H 40/72; H04H 20/62; B60R 11/0217; G10H 1/0091; G10H 1/125; G10H 2210/295; G10H 1/366; G10H 2250/235; G10H 2240/211
USPC ......... 381/310, 17, 307, 309, 300, 303, 61, 1, 381/18, 19, 20, 21, 22, 302, 27, 77, 80, 85, 381/86, 89, 332, 97, 98, 119, 2, 10, 13, 301, 381/306, 28, 59, 336, 101, 102, 103
See application file for complete search history.

(56) References Cited

U.S. PATENT DOCUMENTS

| | | | |
|---|---|---|---|
| 7,266,207 B2 | 9/2007 | Wilcock et al. | |
| 2004/0105550 A1* | 6/2004 | Aylward et al. | 381/17 |
| 2004/0234076 A1* | 11/2004 | Agostini | 381/18 |
| 2006/0045295 A1* | 3/2006 | Kim | 381/310 |
| 2007/0092085 A1* | 4/2007 | Katayama et al. | 381/17 |

FOREIGN PATENT DOCUMENTS

| | | |
|---|---|---|
| JP | 2007-194900 | 8/2007 |
| KR | 10-2006-0019013 | 3/2006 |
| KR | 10-2006-0100221 | 9/2006 |
| KR | 10-2008-0042160 | 5/2008 |

\* cited by examiner

*Primary Examiner* — Leshui Zhang
(74) *Attorney, Agent, or Firm* — Staas & Halsey LLP

(57) ABSTRACT

Provided is an apparatus, method and computer-readable medium generating a vertical direction virtual channel that may apply a vertical direction spectrum shape to a source signal, and generate a vertical direction virtual speaker signal by adjusting a gain with respect to a signal in which the vertical direction spectrum shape is applied, based on virtual speaker direction information.

9 Claims, 7 Drawing Sheets

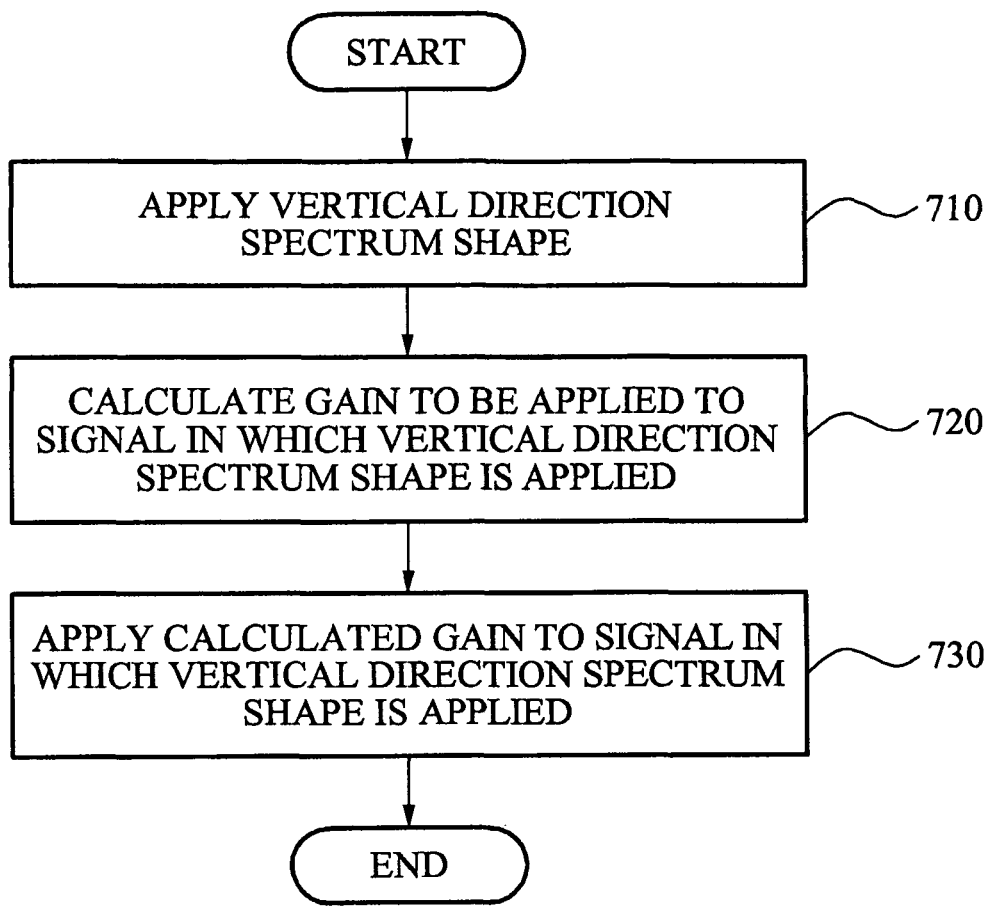

APPARATUS, METHOD AND COMPUTER-READABLE MEDIUM PRODUCING VERTICAL DIRECTION VIRTUAL CHANNEL

CROSS-REFERENCE TO RELATED APPLICATIONS

This application claims the priority benefit of Korean Patent Application No. 10-2010-0021785, filed on Mar. 11, 2010, in the Korean Intellectual Property Office, the disclosure of which is incorporated herein by reference.

BACKGROUND

1. Field

Example embodiments relate to an apparatus, a method and a computer-readable medium generating a virtual channel speaker of a vertical direction.

2. Description of the Related Art

Audio technology has achieved quality-oriented development. However, due to a significant increase in a system capacity, customers increasingly desire reality-oriented audio technology.

Currently, in many audio environments, there may be some constraints on having at least two stereo channels and at least a 5.1 channel speaker system. Accordingly, there is a desire for technology that enables a user to experience audio having at least 5.1 channels through a 5.1 channel speaker system.

As a part of a solution, virtual speaker technology is developed. As an example, the virtual speaker technology may generate a virtual speaker on a horizontal plane. However, to satisfy customers desiring more speakers, technology of generating a virtual sound on a vertical direction plane instead of the horizontal plane may be used.

SUMMARY

The foregoing and/or other aspects are achieved by providing an apparatus generating a vertical direction virtual channel, including a vertical direction spectrum application unit to apply a vertical direction spectrum shape to a source signal, and a vertical direction virtual speaker signal generator to generate a vertical direction virtual speaker signal by adjusting a gain with respect to a signal in which the vertical direction spectrum shape is applied, based on virtual speaker direction information.

The vertical direction spectrum application unit may apply the vertical direction spectrum shape to a left source signal and a right source signal belonging to a top layer.

The vertical direction virtual speaker signal generator may include an interaural level difference (ILD) adjuster to adjust an ILD with respect to a front speaker signal, a left speaker signal, and a right speaker signal by calculating a gain value based on vertical direction virtual speaker direction information, and by applying the calculated gain value to the signal in which the vertical direction spectrum shape is applied.

The ILD adjuster may include a gain value calculator to calculate based on the vertical direction virtual speaker direction information, the gain value to be applied to the signal in which the vertical direction spectrum shape is applied. The ILD adjuster may output the ILD-adjusted front speaker signal, left speaker signal, and right speaker signal by applying the calculated gain value to the signal in which the vertical direction spectrum shape is applied.

The gain value calculator may calculate a first gain value corresponding to a direction of a front speaker, a second gain value corresponding to a direction of a left speaker, and a third gain value corresponding to a direction of a right speaker.

The foregoing and/or other aspects are achieved by providing a method of generating a vertical direction virtual channel, including applying, by at least one processor, a vertical direction spectrum shape to a source signal, and generating, by the at least one processor, a vertical direction virtual speaker signal by adjusting a gain with respect to a signal in which the vertical direction spectrum shape is applied, based on virtual speaker direction information.

The applying may include applying the vertical direction spectrum shape to a left source signal and a right source signal belonging to a top layer.

The generating may include adjusting an interaural level difference (ILD) with respect to a front speaker signal, a left speaker signal, and a right speaker signal by calculating a gain value based on vertical direction virtual speaker direction information, and by applying the calculated gain value to the signal in which the vertical direction spectrum shape is applied.

The adjusting may include calculating, based on the vertical direction virtual speaker direction information, the gain value to be applied to the signal in which the vertical direction spectrum shape is applied, and outputting the ILD-adjusted front speaker signal, left speaker signal, and right speaker signal by applying the calculated gain value to the signal in which the vertical direction spectrum shape is applied.

The calculating may include calculating a first gain value corresponding to a direction of a front speaker, a second gain value corresponding to a direction of a left speaker, and a third gain value corresponding to a direction of a right speaker.

According to another aspect of one or more embodiments, there is provided at least one non-transitory computer readable medium including computer readable instructions that control at least one processor to implement methods of one or more embodiments.

Additional aspects of embodiments will be set forth in part in the description which follows and, in part, will be apparent from the description, or may be learned by practice of the disclosure.

BRIEF DESCRIPTION OF THE DRAWINGS

These and/or other aspects will become apparent and more readily appreciated from the following description of embodiments, taken in conjunction with the accompanying drawings of which:

FIG. 7 illustrates a method of generating a vertical direction virtual speaker according to example embodiments.

DETAILED DESCRIPTION

Figure 1:
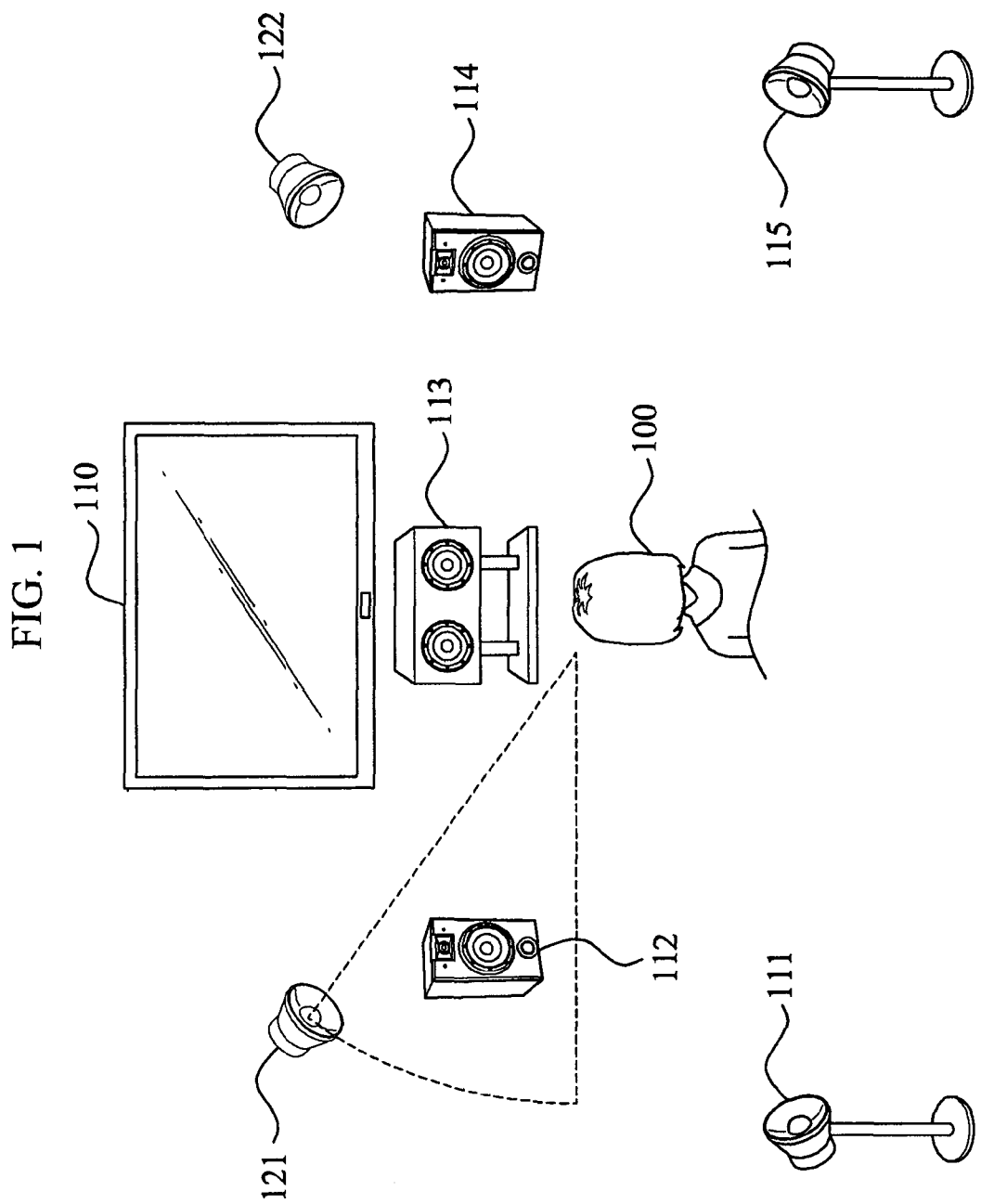
FIG. 1 illustrates a configuration of an audio speaker system including a vertical direction virtual speaker according to example embodiments.

Reference will now be made in detail to embodiments, examples of which are illustrated in the accompanying drawings, wherein like reference numerals refer to like elements throughout. Embodiments are described below to explain the present disclosure by referring to the figures.

Hereinafter, an apparatus, a method and a computer-readable medium generating a vertical direction virtual channel according to example embodiments will be described with reference to the accompanying drawings.

FIG. 1 illustrates a configuration of an audio speaker system including a vertical direction virtual speaker according to example embodiments.

Referring to FIG. 1, the audio speaker system may be an audio speaker system providing sound in association with a display 110. According to a viewing and listening location of a user 100, the audio speaker system may include a left surround speaker 111, a front left speaker 112, a front central speaker 113, a front right speaker 114, a right surround speaker 115, a left vertical direction virtual speaker 121, and a right vertical direction virtual speaker 122.

The left vertical direction virtual speaker 121 may be a virtual speaker outputting a left vertical direction virtual speaker signal, so that the user 100 may experience and sense that a sound is coming from a left vertical direction, using the left surround speaker 111, the front left speaker 112, and the right surround speaker 115. Specifically, the left vertical direction virtual speaker 121 may be an indication unit to indicate a position in order to give to the user 100 a sense that a speaker is installed in a left vertical direction and the sound is output as the left vertical direction virtual speaker signal is output. The left vertical direction virtual speaker 121 may be not an actual speaker but may be a virtual speaker.

The right vertical direction virtual speaker 122 may be a virtual speaker outputting a right vertical direction virtual speaker signal, so that the user 100 may experience and sense that a sound is coming from a right vertical direction, using the right surround speaker 115, the front right speaker 114, and the left surround speaker 111. Specifically, the right vertical direction virtual speaker 122 may be an indication unit to indicate a position in order to give to the user 100 a sense that a speaker is installed in a right vertical direction and the sound is output as the right vertical direction virtual speaker signal is output. The right vertical direction virtual speaker 122 may be not an actual speaker but may be a virtual speaker.

Figure 2:
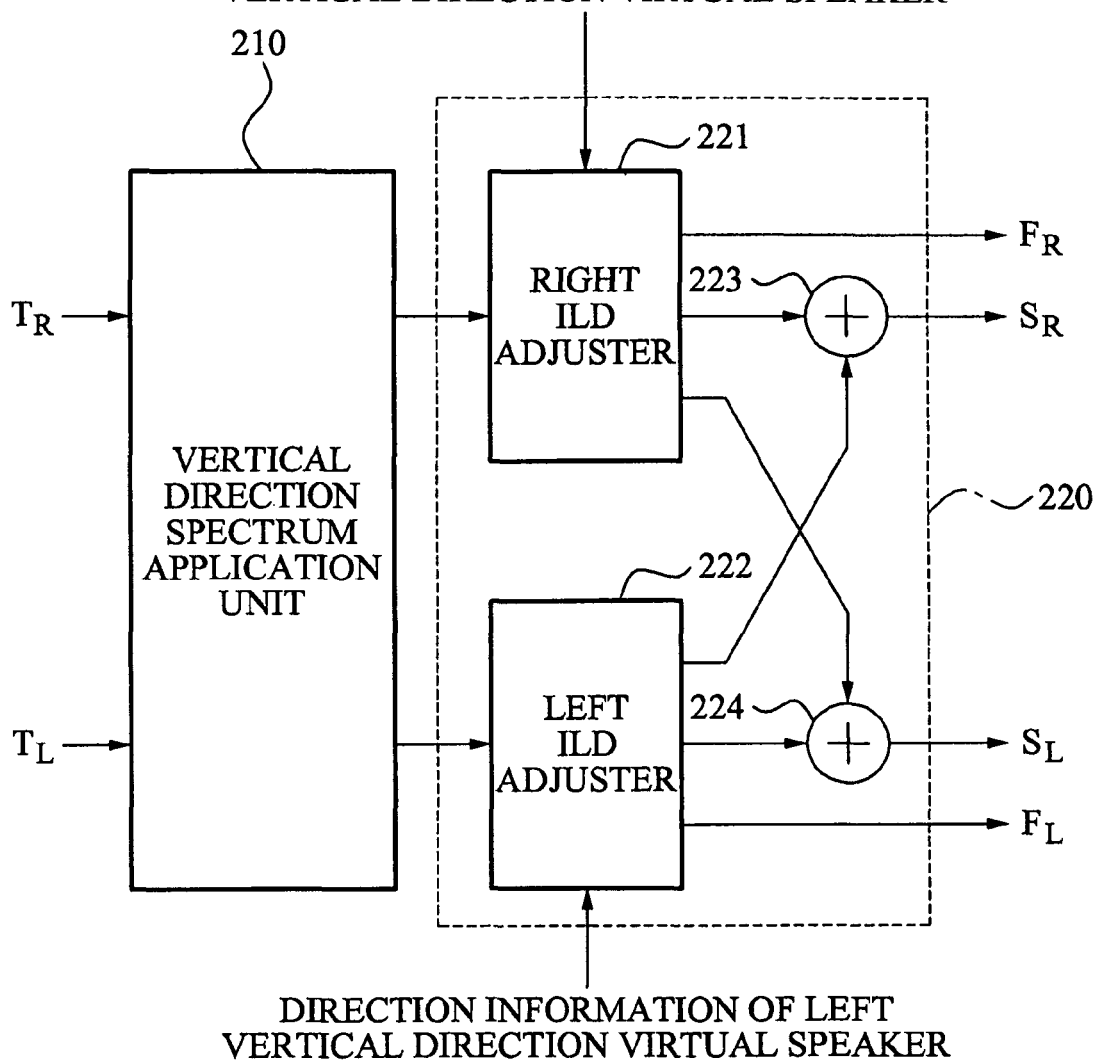
FIG. 2 illustrates a configuration of an apparatus generating a vertical direction virtual channel according to example embodiments.

FIG. 2 illustrates a configuration of an apparatus 200 generating a vertical direction virtual channel according to example embodiments.

Referring to FIG. 2, the vertical direction virtual channel generating apparatus 200 may include a vertical direction spectrum application unit 210 and a vertical direction virtual speaker signal generator 220.

The vertical direction spectrum application unit 210 may apply a vertical direction spectrum shape to a source signal. Specifically, the vertical direction spectrum application unit 210 may receive a left source signal $T_L$ and a right source signal $T_R$ belonging to a top layer, and may apply the vertical direction spectrum shape to the input left source signal $T_L$ and right source signal $T_R$.

Figure 3:
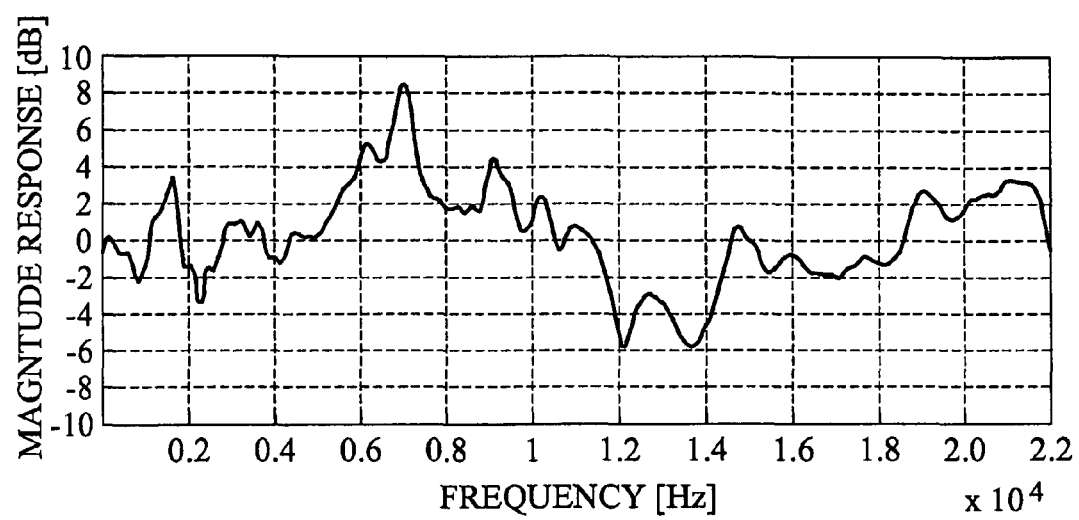
FIG. 3 illustrates an example of a change in a shape of a spectrum reaching ears of a human being according to a position of a sound source.

FIG. 3 illustrates an example of a change in a shape of a spectrum reaching ears of a human being according to a position of a sound source.

Referring to FIG. 3, the shape of the spectrum reaching the ears of the human being may vary according to the position of the sound source. FIG. 3 illustrates a spectrum characteristic when the vertical direction sound source is 30 degrees in an azimuth axis and is 60 degrees in an elevation axis, and a loud speaker is 30 degrees in the azimuth axis and is zero degrees in the elevation axis.

When a direction of the front left loud speaker or front right loud speaker is θ in the azimuth axis and a direction of the front left speaker or front right speaker is $\phi_0$ in the elevation axis and direction of the sound source intended to vertical location is φ in elevation axis, the spectrum characteristic of the vertical direction sound source may be expressed by Equation 1.

$$\sigma_{\theta,\phi} = \frac{H_{\theta,\phi}}{H_{\theta,\phi_0}}$$ [Equation 1]

Figure 4:
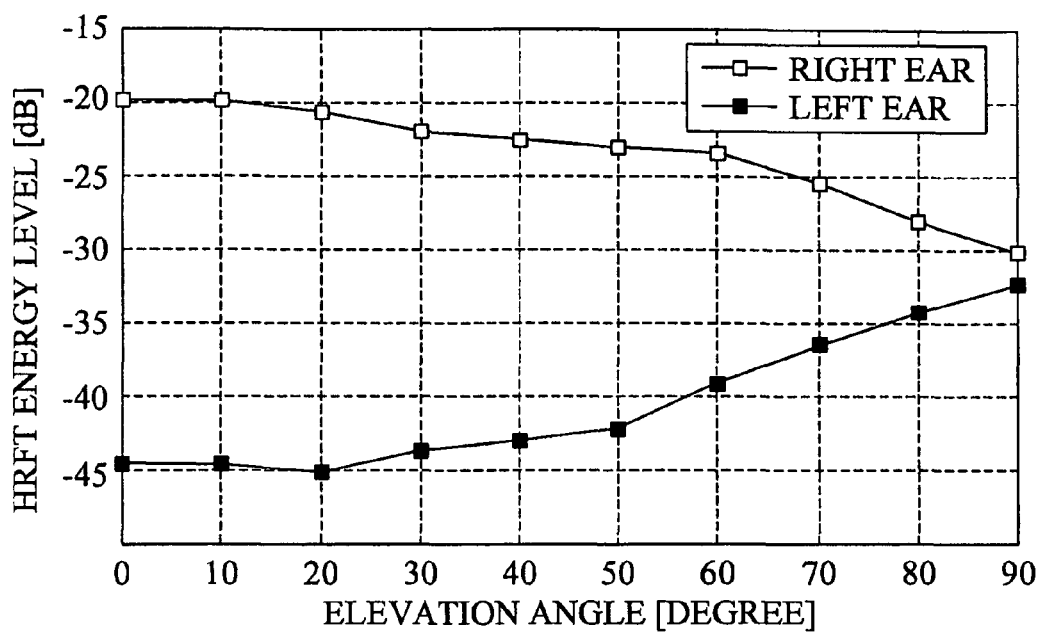
FIG. 4 illustrates an example of a change in an energy level of a signal according to an elevation angle.

FIG. 4 illustrates an example of a change in an energy level of a signal reaching each ear according to an elevation angle.

Referring to FIG. 4, even though a vertical direction spectrum characteristic is applied to a loud speaker leaning to one direction, a phenomenon that an ILD decrease in a great elevation angle may not be reflected. Accordingly, it may be impossible to achieve a high vertical direction effect. To apply the ILD, the vertical direction virtual channel generating apparatus 200 may need to apply a gain using a pair of surround speakers.

The vertical direction virtual speaker signal generator 220 may generate a vertical direction virtual speaker signal by adjusting a gain with respect to a signal in which a vertical direction spectrum shape is applied based on virtual speaker direction information. Specifically, the vertical direction virtual speaker signal generator 200 may generate the vertical direction virtual speaker signal to be output to left and right surround speakers, and a right or a left front speaker by adjusting left and right ILDs based on directional information of a left vertical virtual speaker, and by adjusting left and right ILDs based on directional information of a right vertical virtual speaker. For example, the vertical direction virtual speaker signal generator 220 may generate the vertical direction virtual speaker signal and a magnitude of the vertical direction virtual speaker signal may be distributed and be output to the surround speakers and the front speaker, by applying a Vector Based Amplitude Panning (VBAP) scheme.

The vertical direction virtual speaker signal generator 220 may include a right ILD adjuster 221, a left ILD adjuster 222, a first adder 223, and a second adder 224.

The right ILD adjuster 221 may output a front right signal $F_R$ by applying direction information of the right vertical direction virtual speaker 122 to the signal where the vertical direction spectrum shape is applied, and by adjusting an ILD with respect to a right speaker signal.

The left ILD adjuster 222 may output a front left signal $F_L$ by applying direction information of the left vertical direction virtual speaker 121 to the signal where the vertical direction spectrum shape is applied, and by adjusting an ILD with respect to a left speaker signal.

The first adder 223 may output a surround right signal $S_R$ by adding up a signal output from the right ILD adjuster 221 and a signal output from the left ILD adjuster 222.

The second adder 224 may output a surround left signal $S_L$ by adding up the signal output from the right ILD adjuster 221 and the signal output from the left ILD adjuster 222.

Figure 5:
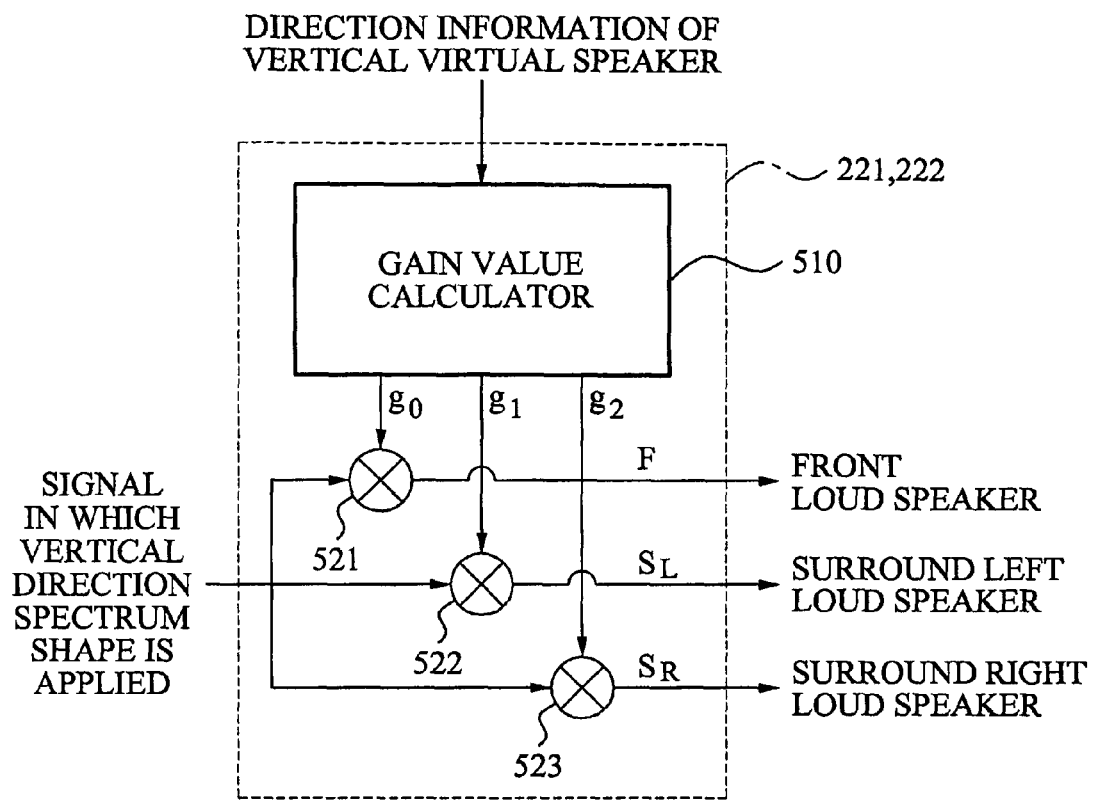
FIG. 5 illustrates a configuration of an interaural level difference (ILD) adjuster according to example embodiments.

An ILD adjuster including the left ILD adjuster 221 and the right ILD adjuster 222 may further include a gain value calculator 510 of FIG. 5 to calculate, based on the directional information of a vertical virtual speaker, a gain value to be applied to the signal in which the vertical direction spectrum shape is applied.

FIG. 5 illustrates a configuration of an ILD adjuster according to example embodiments.

Referring to FIG. 5, the ILD adjustment including the left ILD adjuster 221 and the right ILD adjuster 222 of FIG. 2 may include the gain value calculator 510, a first multiplier 521, a second multiplier 522, and a third multiplier 523.

The ILD adjuster may adjust an ILD with respect to a left speaker or a right speaker by applying, to a signal in which a vertical direction spectrum shape is applied, a gain value calculated based on the directional information of the vertical virtual speaker.

The gain value calculator 510 may calculate a first gain value $g_0$ corresponding to a direction of a front speaker, a second gain value $g_1$ corresponding to a direction of a left speaker, and a third gain value g2 corresponding to a direction of a right speaker, based on the directional information of the vertical virtual speaker.

Figure 6:
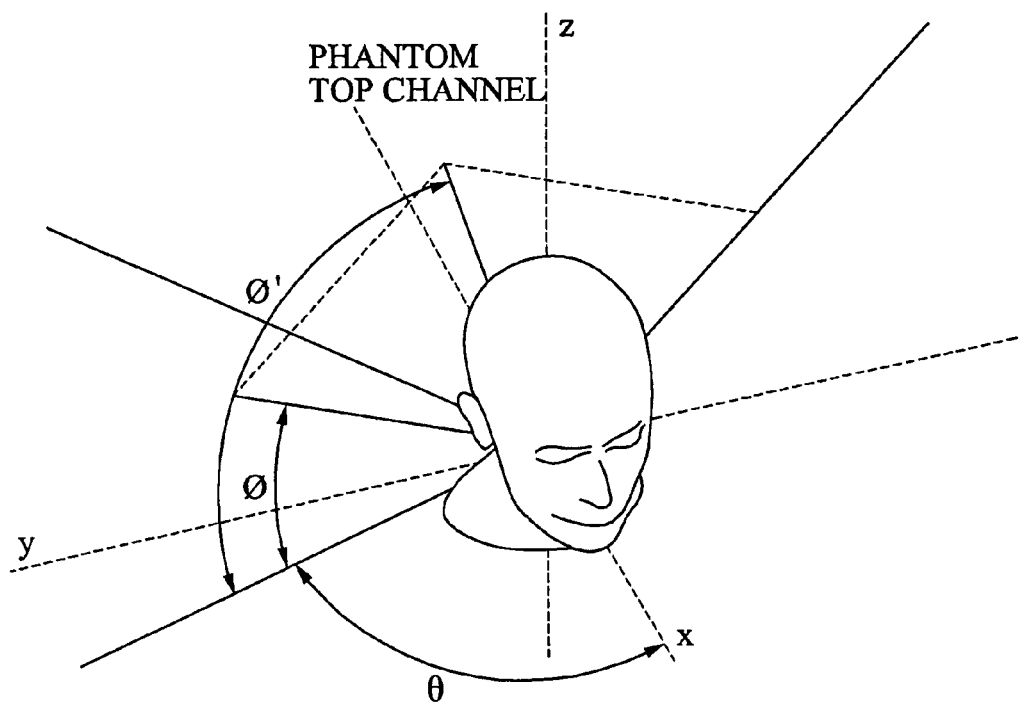
FIG. 6 illustrates vector information of a vertical direction virtual channel according to example embodiments.

FIG. 6 illustrates vector information of a vertical direction virtual speaker according to example embodiments.

Referring to FIG. 6, vector information, i.e., a phantom top channel of the vertical direction virtual speaker may use an elevation angle of a signal in which a vertical direction spectrum shape is applied, and an elevation angle of the vertical direction virtual speaker.

For example, the gain value calculator 510 may calculate a gain value g based on directional information of the vertical virtual speaker according to Equation 2.

$$g = pL^{-1} \qquad \text{[Equation 2]}$$
$$P = [\cos\phi'\cos\theta \quad \cos\phi'\sin\theta \quad \sin\phi']$$
$$L = \begin{bmatrix} \cos\phi\cos\theta_F & \cos\phi\sin\theta_F & \sin\phi \\ \cos\phi\cos\theta_{SR} & \cos\phi\sin\theta_{SR} & \sin\phi \\ \cos\phi\cos\theta_{SL} & \cos\phi\sin\theta_{SL} & \sin\phi \end{bmatrix}$$

In Equation 2, L denotes vector information when the signal in which the vertical direction spectrum shape is applied is allocated to three loud speakers, φ denotes the elevation angle of the signal in which the vertical direction spectrum shape is applied, φ' denotes the elevation angle of the vertical direction virtual speaker, θ denotes a horizontal plane angle of the vertical direction virtual speaker, $\theta_F$ denotes a horizontal plane angle of a front loud speaker, $\theta_{SL}$ denotes a horizontal plane angle of a surround left loud speaker, and $\theta_{SR}$ denotes a horizontal plane angle of a surround right loud speaker.

The first multiplier 521 may output a front loud speaker signal F by multiplying the first gain value $g_0$ and the signal in which the vertical direction spectrum shape is applied.

The second multiplier 522 may output a surround left loud speaker signal $S_L$ by multiplying the second gain value $g_1$ and the signal in which the vertical direction spectrum shape is applied.

The third multiplier 523 may output a surround right loud speaker signal $S_R$ by multiplying the third gain value $g_2$ and the signal in which the vertical direction spectrum shape is applied.

As described above, an apparatus generating a vertical direction virtual channel according to example embodiments may provide a vertical direction virtual speaker signal in addition to a speaker on a horizontal plane for a multi-channel speaker system, and may not require installation of an additional loud speaker. As a result, the apparatus may be more readily distributed to general users resulting in reduced installation requirements and a more realistic audio experience.

FIG. 7 illustrates a method of generating a vertical direction virtual speaker according to example embodiments.

In operation 710, the vertical direction virtual channel generating apparatus 200 may apply a vertical direction spectrum shape to a source signal. Specifically, the vertical direction virtual channel generating apparatus 200 may apply the vertical direction spectrum shape to a left source signal $T_L$ and a right source signal $T_R$ belonging to a top layer, using the vertical direction spectrum application unit 210.

In operation 720, the vertical direction virtual channel generating apparatus 200 may calculate a gain to be applied to the signal in which the vertical direction spectrum shape is applied, based on directional information of the vertical virtual speaker. Specifically, the vertical direction virtual channel generating apparatus 200 may calculate a gain value to be applied to the signal in which the vertical direction spectrum shape is applied, based on the directional information of vertical virtual speaker, using the vertical direction virtual speaker signal generator 220. For example, the vertical direction virtual channel generating apparatus 200 may calculate a first gain value corresponding to a direction of a front speaker, a second gain value corresponding to a direction of a left speaker, and a third gain value corresponding to a direction of a right speaker, based on the directional information of the vertical virtual speaker, using the vertical direction virtual speaker signal generator 220.

In operation 730, the vertical direction virtual channel generating apparatus 200 may generate a vertical direction virtual speaker signal by applying the calculated gain value to the signal in which the vertical direction spectrum shape is applied. Specifically, the vertical direction virtual channel generating apparatus 200 may adjust an ILD with respect to a front speaker signal, a left speaker signal, and a right speaker signal by calculating a gain value based on the vertical direction virtual speaker direction information, and by applying the calculated gain value to the signal in which the vertical direction spectrum shape is applied, using the vertical direction virtual speaker signal generator 220.

The vertical direction virtual channel generating apparatus 200 may output the ILD-adjusted front speaker signal, left speaker signal, and right speaker signal by applying the calculated gain value to the signal in which the vertical direction spectrum shape is applied, using the vertical direction virtual speaker signal generator 220.

As described above, the vertical direction virtual channel generating method according to example embodiments may provide a vertical direction virtual speaker signal in addition to a speaker on a horizontal plane for a multi-channel speaker system.

The above-described embodiments may be recorded in non-transitory computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. The computer-readable media may be a plurality of computer-readable storage devices in a distributed network, so that the program instructions are stored in the plurality of computer-readable storage devices and executed in a distributed fashion. The program instructions may be executed by one or more processors or processing devices. The computer-readable media may also be embodied in at least one application specific integrated circuit (ASIC) or Field Programmable Gate Array (FPGA). Examples of program instructions include both machine code, such as produced by a compiler, and files containing higher level code that may be executed by the computer using an interpreter. The described hardware devices may be configured to act as one or more software modules in order to perform the operations of the above-described exemplary embodiments, or vice versa.

Although embodiments have been shown and described, it should be appreciated by those skilled in the art that changes may be made in these embodiments without departing from the principles and spirit of the disclosure, the scope of which is defined by the claims and their equivalents.

What is claimed is:

1. An apparatus generating a vertical direction virtual channel, comprising:
   a vertical direction spectrum application unit to apply, using a processor, a vertical direction spectrum characteristic to an audio source signal including at least one audio signal of a top layer; and
   a vertical direction virtual speaker signal generator to generate, using a processor, a vertical direction virtual speaker signal by adjusting a gain with respect to the audio signal in which the vertical direction spectrum characteristic is applied, based on virtual speaker direction information,
   wherein the vertical direction virtual speaker signal generator comprises:
      an interaural level difference (ILD) adjuster to adjust an ILD with respect to a first speaker signal, a second speaker signal, and a third speaker signal by calculating a gain value based on directional information of a vertical virtual speaker and directional information of the audio signal to which the vertical direction spectrum characteristic is applied, and by applying the calculated gain value to the signal in which the vertical direction spectrum characteristic is applied,
      wherein the first speaker signal is output to a first speaker,
      wherein the second speaker signal is output to a second speaker and
      wherein the third speaker signal is output to a third speaker.

2. The apparatus of claim 1, wherein the at least one audio signal of the top layer includes at least one of a left source signal of the top layer and a right source signal of the top layer.

3. The apparatus of claim 1, wherein the ILD adjuster comprises:
   a gain value calculator to calculate, based on the directional information of the vertical virtual speaker, the gain value to be applied to the audio signal in which the vertical direction spectrum characteristic is applied, and
   the ILD adjuster outputs the ILD-adjusted first speaker signal, second speaker signal, and third speaker signal by applying the calculated gain value to the audio signal in which the vertical direction spectrum characteristic is applied.

4. The apparatus of claim 3, wherein the gain value calculator calculates a first gain value corresponding to a direction of the first speaker, a second gain value corresponding to a direction of the second speaker, and a third gain value corresponding to a direction of the third speaker.

5. A method of generating a vertical direction virtual channel, comprising:
   applying, by at least one processor, a vertical direction spectrum characteristic to an audio source signal including at least one audio signal of a top layer; and
   generating, by the at least one processor, a vertical direction virtual speaker signal by adjusting a gain with respect to the audio signal in which the vertical direction spectrum characteristic is applied, based on virtual speaker direction information,
   wherein the generating comprises adjusting an interaural level difference (ILD) with respect to a first speaker signal, a second speaker signal, and a third speaker signal by calculating a gain value based on directional information of a vertical virtual speaker and directional information of the audio signal to which the vertical direction spectrum characteristic is applied, and by applying the calculated gain value to the signal in which the vertical direction spectrum characteristic is applied,
   wherein the first speaker signal is output to a first speaker,
   wherein the second speaker signal is output to a second speaker and
   wherein the third speaker signal is output to a third speaker.

6. The method of claim 5, wherein the applying a vertical direction spectrum characteristic to the audio signal comprises applying the vertical direction spectrum characteristic to a left source signal of the top layer and a right source signal of the top layer.

7. The method of claim 5, wherein the adjusting comprises:
   calculating, based on the directional information of the vertical virtual speaker, the gain value to be applied to the audio signal in which the vertical direction spectrum characteristic is applied; and
   outputting the ILD-adjusted first speaker signal, second speaker signal, and third speaker signal by applying the calculated gain value to the audio signal in which the vertical direction spectrum characteristic is applied.

8. The method of claim 7, wherein the calculating comprises calculating a first gain value corresponding to a direction of a first speaker, a second gain value corresponding to a direction of a second speaker, and a third gain value corresponding to a direction of a third speaker.

9. At least one non-transitory computer-readable medium comprising computer readable instructions that control at least one processor to implement a method of generating a vertical direction virtual channel, comprising:
   applying a vertical direction spectrum characteristic to an audio source signal including at least one audio signal of a top layer; and
   generating a vertical direction virtual speaker signal by adjusting a gain with respect to the audio signal in which the vertical direction spectrum characteristic is applied, based on virtual speaker direction information,
   wherein the generating comprises adjusting an interaural level difference (ILD) with respect to a first speaker signal, a second speaker signal, and a third speaker signal by calculating a gain value based on directional information of a vertical virtual speaker and directional information of the audio signal to which the vertical direction spectrum characteristic is applied, and by applying the calculated gain value to the audio signal in which the vertical direction spectrum characteristic is applied,
   wherein the first speaker signal is output to a first speaker,
   wherein the second speaker signal is output to a second speaker and
   wherein the third speaker signal is output to a third speaker.

* * * * *